(12) United States Patent
Doorenbos et al.

(10) Patent No.: US 10,305,507 B1
(45) Date of Patent: May 28, 2019

(54) FIRST-ORDER SIGMA-DELTA ANALOG-TO-DIGITAL CONVERTER

(71) Applicant: TEXAS INSTRUMENTS INCORPORATED, Dallas, TX (US)

(72) Inventors: Jerry Lee Doorenbos, Tucson, AZ (US); Keith Eric Sanborn, Tucson, AZ (US); Mina Raymond Naguib Nashed, Tucson, AZ (US); Srikanth Vellore Avadhanam Ramamurthy, Tucson, AZ (US); Dwight David Griffin, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/982,670

(22) Filed: May 17, 2018

Related U.S. Application Data

(60) Provisional application No. 62/645,205, filed on Mar. 20, 2018.

(51) Int. Cl.
*H03M 3/00* (2006.01)

(52) U.S. Cl.
CPC ........... *H03M 3/456* (2013.01); *H03M 3/458* (2013.01)

(58) Field of Classification Search
CPC .............................. H03M 3/456; H03M 3/458
USPC .................................................. 341/143–155
See application file for complete search history.

(56) References Cited

U.S. PATENT DOCUMENTS

| | | | | |
|---|---|---|---|---|
| 6,940,436 B2 * | 9/2005 | Hezar | ................... | H03M 3/412 341/143 |
| 6,943,717 B1 * | 9/2005 | Forejt | ................... | H03F 3/2175 341/143 |
| 7,057,540 B2 * | 6/2006 | Muhammad | ............ | H03M 3/47 341/143 |
| 7,071,982 B2 * | 7/2006 | Luo | ........................ | H04N 5/353 250/208.1 |
| 7,474,345 B2 * | 1/2009 | Luo | ........................ | H04N 5/335 348/297 |
| 7,495,589 B1 * | 2/2009 | Trifonov | ............. | H03M 1/1019 341/118 |
| 7,504,977 B2 * | 3/2009 | Doorenbos | ........... | H03M 1/145 341/122 |
| 2008/0258959 A1 * | 10/2008 | Trifonov | ............... | H03M 1/145 341/156 |
| 2008/0272944 A1 * | 11/2008 | Zhou | ..................... | H03M 3/352 341/143 |
| 2009/0195423 A1 * | 8/2009 | Li | ........................ | H03M 3/474 341/110 |
| 2010/0328122 A1 * | 12/2010 | Li | ........................ | H03M 3/474 341/122 |

* cited by examiner

*Primary Examiner* — Lam T Mai
(74) *Attorney, Agent, or Firm* — John R. Pessetto; Charles A. Brill; Frank D. Cimino

(57) ABSTRACT

A first-order sigma-delta analog-to-digital converter includes an input terminal, an integrator circuit, a comparator, and control circuitry. The input terminal is configured to receive a unipolar input signal to be digitized. The integrator circuit is coupled to the input terminal. The comparator is coupled to an output of the integrator circuit. The control circuitry is coupled to the integrator circuit and the comparator. The control circuitry is configured to equalize time that an output signal generated by the integrator circuit is greater than zero and time that the output signal generated by the integrator circuit is less than zero during digitization of the unipolar input signal.

20 Claims, 8 Drawing Sheets

FIRST-ORDER SIGMA-DELTA ANALOG-TO-DIGITAL CONVERTER

CROSS-REFERENCE TO RELATED APPLICATIONS

The present application claims priority to U.S. Provisional Patent Application No. 62/645,205, filed Mar. 20, 2018, titled "Method for Improving Accuracy of a First-Order Sigma-Delta ADC with Low Open-Loop Gain Integrator," which is hereby incorporated herein by reference in its entirety.

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations typically affects the noise level of any result as well as the resolution of the ultimate digital signal.

Sigma-delta analog-to-digital converters employ sigma-delta modulation techniques that digitize an input signal using very low resolution (e.g., one-bit) and a high sampling rate. Oversampling and the use of digital filters increases the resolution to as many as twenty or more bits. Sigma-delta analog-to-digital converters are especially useful for high resolution conversion of low to moderate frequency signals.

SUMMARY

A first-order sigma-delta analog-to-digital converter that balances integrator leakage errors by providing symmetrical swing about zero while digitizing a unipolar signal is disclosed herein. In one example, a first-order sigma-delta analog-to-digital converter includes an input terminal, an integrator circuit, a comparator, and control circuitry. The input terminal is configured to receive a unipolar input signal to be digitized. The integrator circuit is coupled to the input terminal. The comparator is coupled to an output of the integrator circuit. The control circuitry is coupled to the integrator circuit and the comparator. The control circuitry is configured to equalize time that an output signal generated by the integrator circuit is greater than zero and time that the output signal generated by the integrator circuit is less than zero during digitization of the unipolar input signal.

In another example, a method for operating a first-order sigma-delta analog-to-digital converter includes receiving a unipolar signal for digitization. Digitization of the unipolar signal is initiated by setting an output signal generated by an integrator circuit of the first-order sigma-delta analog-to-digital converter to one-half of a reference voltage below zero volts. During digitization of the unipolar signal, the reference voltage is repeatedly subtracted from the output signal generated by the integrator circuit to equalize time that an output signal generated by the integrator circuit is greater than zero and time that the output signal generated by the integrator circuit is less than zero.

In a further example, a first-order sigma-delta analog-to-digital converter includes an input terminal, an integrator circuit, a comparator, and control circuitry. The input terminal is to receive a unipolar input signal to be digitized. The integrator circuit is coupled to the input terminal. The integrator circuit includes a differential amplifier, a first input capacitor, a second input capacitor, a first switch, and a second switch. The first input capacitor includes a first terminal coupled to a non-inverting input terminal of the differential amplifier. The second input capacitor includes a first terminal coupled to an inverting input terminal of the differential amplifier. The first switch includes a first terminal coupled to a second terminal of the first input capacitor, and a second terminal coupled to a power supply voltage. The second switch includes a first terminal coupled to a second terminal of the second input capacitor, and a second terminal coupled to the power supply voltage. The comparator is coupled to an output of the integrator circuit. The control circuitry is coupled to the first switch, the second switch, and the comparator.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Applications that digitize low frequency signals, such as smart sensor applications like temperature, pressure, and/or humidity sensing, may use a first-order sigma-delta analog-to-digital converter to take advantage of the converter's small size and simple topology. However, the finite open-loop gain of the operational amplifier used in the integrator of a first-order sigma-delta analog-to-digital converter results in leakage of the charge stored by the feedback capacitors that represents the sensed signal. The leakage degrades the accuracy of the final digitized output value. In order to avoid this problem, some implementations of a first-order sigma-delta analog-to-digital converter use a very high open-loop gain operational amplifier (e.g., 100 dB gain) in the converter's integrator circuit. Other implementations employ a window comparator (rather than a single-threshold comparator), or forgo a first-order sigma-delta analog-to-digital converter in favor of a higher order sigma-delta analog-to-digital converter. However, such solutions inevitably increase power consumption, silicon area, and circuit complexity in the sigma-delta converter.

The first-order sigma-delta analog-to-digital converters disclosed herein reduce or eliminate the problems associated with charge leakage for digitizing unipolar input signals without adding substantial analog circuitry. During digitization, implementations of a sigma-delta analog-to-digital converter balance the differential output voltage swing of the converter's integrator symmetrically about zero volts. As a result, the integrator accumulates an equal magnitude of positive errors and negative errors due the finite open loop gain of the integrator's operational amplifier, and the accumulated errors cancel each other out over the entirety of the digitization.

Figure 1:
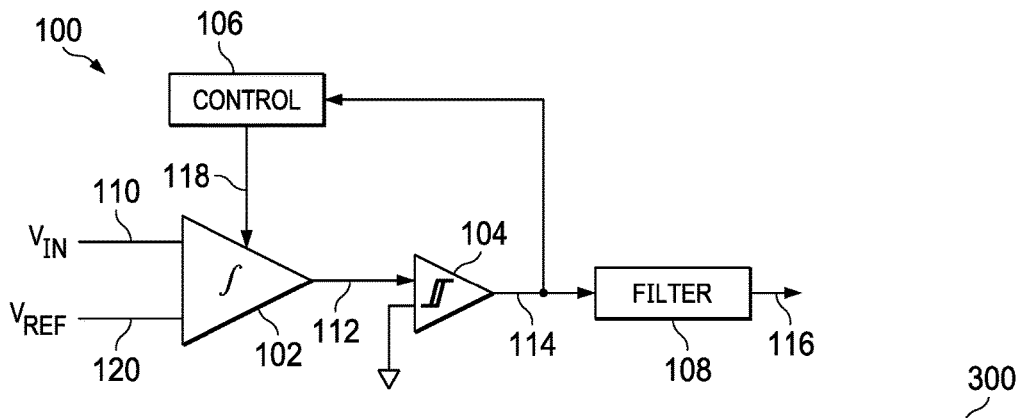
FIG. 1 shows a block diagram for an example of a first-order sigma-delta analog-to-digital converter in accordance with the present disclosure.

FIG. 1 shows a block diagram for an example of a first-order sigma-delta analog-to-digital converter 100 in accordance with the present disclosure. The first-order sigma-delta analog-to-digital converter 100 includes an integrator circuit 102, a comparator 104, control circuitry 106, filter circuitry 108, a signal input terminal 110, and a reference terminal 120. The signal input terminal 110 receives an input signal $V_{IN}$ to be digitized. The reference terminal 120 receives a reference voltage $V_{REF}$ for use in controlling the integration of $V_{IN}$. The signal $V_{IN}$ is unipolar. That is, the signal $V_{IN}$ does not transition from a positive voltage to a negative voltage, or vice versa, while $V_{IN}$ is being digitized. The integrator circuit 102 is coupled to the signal input terminal 110, and integrates samples of the input signal under the control of the control circuitry 106. Output 112 of the integrator 102 is provided as input to the comparator 104. The comparator 104 may compare the output 112 of the integrator circuit 102 to ground or another reference voltage to determine the polarity of the output 112 of the integrator circuit 102. The results 114 of comparison in the comparator 104 are provided to the filter circuitry 108 and to the control circuitry 106. The filter circuitry 108 includes circuitry, such as digital filtering circuitry, that combines results of multiple comparisons by the comparator 104 to produce a multi-bit output value 116 that represents that voltage at the signal input terminal 110.

The control circuitry 106 is coupled to the integrator circuit 102 and the comparator 104. Based on the result 114 produced by the comparator 104, the control circuitry 106 controls the operation of the integrator circuit 102 such that the output 112 is substantially symmetrical about zero volts. For example, time the output voltage of the integrator circuit 102 is positive is substantially equal to the time that output voltage of the integrator circuit 102 is negative. The control circuitry 106 causes the output 112 to go negative by subtracting $V_{REF}$ or $V_{REF}/2$ from the output 112 at various times during the digitization of $V_{IN}$. In various implementations of the first-order sigma-delta analog-to-digital converter 100, subtracting $V_{REF}$ or $V_{REF}/2$ from the output 112 includes gain applied to $V_{REF}$ or $V_{REF}/2$ by the integrator circuit 102 or by a process applied to the integrator circuit 102. For example, gain is applied to integrator input signals, such as $V_{REF}$ or $V_{REF}/2$ as a function of the ratio of integrator input capacitance to integrator feedback capacitance, or by application of a process such as correlated double sampling to the integrator circuit 102. Thus, references herein to setting the output 112 of the integrator circuit 102 to $+/-V_{REF}$ or $+/-V_{REF}/2$, or adding or subtracting $V_{REF}$ or $V_{REF}/2$ from the output 112 of the integrator circuit 102 refer to $V_{REF}$ or $V_{REF}/2$ with gain applied in the integrator circuit 102.

Figure 2:
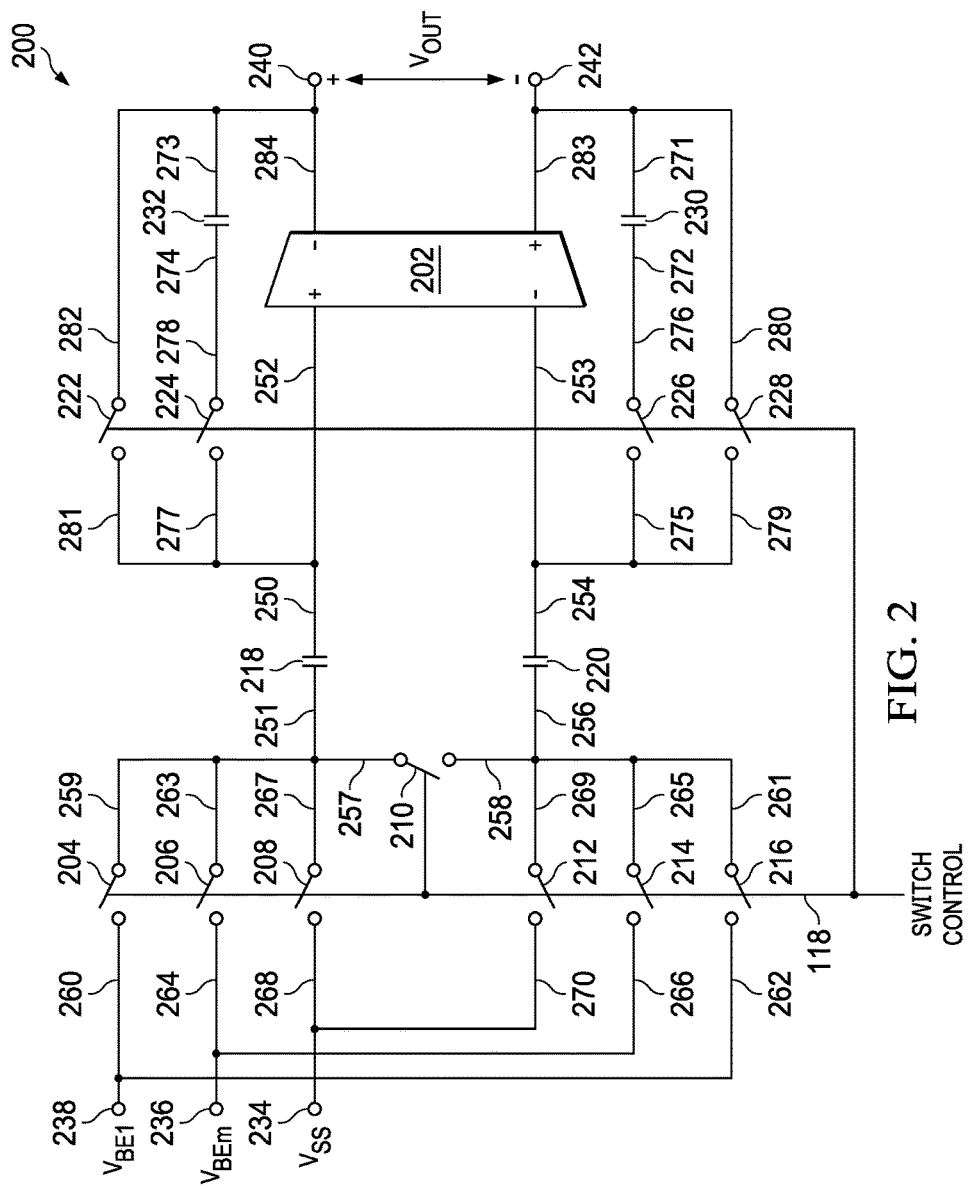
FIG. 2 shows a block diagram for an example of an integrator circuit used in a first-order sigma-delta analog-to-digital converter in accordance with the present disclosure.

FIG. 2 shows a block diagram for an example of an integrator circuit 200 used in a first order sigma-delta analog-to-digital converter in accordance with the present disclosure. The integrator circuit 200 is an implementation of the integrator circuit 102. The integrator circuit 200 includes a differential amplifier 202, a switch 204, a switch 206, a switch 208, a switch 210, a switch 212, a switch 214, a switch 216, a capacitor 218, a capacitor 220, a switch 222, a switch 224, a switch 226, a switch 228, a capacitor 230, and a capacitor 232. Reference voltages and signal to be digitized are provided to the integrator circuit 200 via the input terminals 234, 236, and 238. The input terminals 234, 236, and 238 receive reference and input signals for provision to the integrator circuit 200. In FIG. 2, the input terminal 234 connects a power supply voltage ($V_{SS}$) to the integrator circuit 200, wherein $V_{SS}$ is ground or a negative voltage in various implementations. The input terminals 236 and 238 connect input signal and reference voltage to the integrator circuit 200.

The capacitor 218 couples a non-inverting input of the differential amplifier 202 to the input terminals 234, 236, and 238 of the integrator circuit 200. The capacitor 220 couples an inverting input of the differential amplifier 202 to the input terminals 234, 236, and 238 of the integrator circuit 200. More specifically, a first terminal 254 of the capacitor 220 is coupled to an inverting input terminal 253 of the differential amplifier 202, and a first terminal 250 of the capacitor 218 is coupled to a non-inverting input terminal 252 of the differential amplifier 202.

The switch 204, switch 206, and switch 208 control routing of signal from the input terminals 234, 236, and 238 to the capacitor 218 to allow charging of the capacitor 218 to the voltages provided at the input terminals 234, 236, and 238. The switch 204 switchably couples the input terminal 238 to the capacitor 218. The switch 206 switchably couples the input terminal 236 to the capacitor 218. The switch 208 switchably couples the input terminal 234 to the capacitor 218. More specifically, a first terminal 260 of the switch 204 is coupled to the input terminal 238, and a second terminal 259 of the switch 204 is coupled to a second terminal 251 of the capacitor 218. A first terminal 264 of the switch 206 is coupled to the input terminal 236, and a second terminal 263 of the switch 206 is coupled to the second terminal 251 of the capacitor 218. A first terminal 268 of the switch 208 is coupled to the input terminal 234, and a second terminal 267 of the switch 208 is coupled to the second terminal 251 of the capacitor 218.

The switch 212, switch 214, and switch 216 control routing of signal from the input terminals 234, 236, and 238 to the capacitor 220 to allow charging of the capacitor 220 to the voltages provided at the input terminals 234, 236, and 238. The switch 216 switchably couples the input terminal 238 to the capacitor 220. The switch 214 switchably couples the input terminal 236 to capacitor 220. The switch 212 switchably couples the input terminal 234 to capacitor 220. More specifically, a first terminal 262 of the switch 216 is coupled to the input terminal 238, and a second terminal 261 of the switch 216 is coupled to a second terminal 256 of the capacitor 220. A first terminal 266 of the switch 214 is coupled to the input terminal 236, and a second terminal 265 of the switch 214 is coupled to the second terminal 256 of the capacitor 220. A first terminal 270 of the switch 212 is coupled to the input terminal 234, and a second terminal 269 of the switch 212 is coupled to the second terminal 256 of the capacitor 220.

The switch 210 switchably couples the capacitor 218 to the capacitor 220 to allow distribution of charge between the capacitor 218 and the capacitor 220. More specifically, a first terminal 257 of the switch 210 is coupled to the second terminal 251 of the capacitor 218, and a second terminal 258 of the switch 210 is coupled to the second terminal 256 of the capacitor 220.

The capacitor 232 is connected in the feedback path from the inverting output of the differential amplifier 202 to the non-inverting input of the differential amplifier 202. The capacitor 232 includes first terminal 273 that is coupled to the inverting output terminal 284 of the differential amplifier 202. The switch 224 switchably couples the capacitor 232 to the non-inverting input of the differential amplifier 202. The switch 224 includes a first terminal 278 that is coupled to a second terminal 274 of the capacitor 232. A second terminal 277 of the switch 224 is coupled to the non-inverting input terminal 252 of the differential amplifier 202. The switch 222 is connected in the feedback path of the differential amplifier 202 in parallel with the switch 224 and the capacitor 232 to switchably connect the non-inverting input terminal 252 to the inverting output terminal 284. The switch 222 includes a first terminal 281 that is coupled to the non-inverting input terminal 252, and a second terminal 282 that is coupled to the inverting output terminal 284.

The capacitor 230 is connected in the feedback path from the non-inverting output of the differential amplifier 202 to the inverting input of the differential amplifier 202. The capacitor 230 includes first terminal 271 that is coupled to the non-inverting output terminal 283 of the differential amplifier 202. The switch 226 switchably couples the capacitor 230 to the inverting input of the differential amplifier 202. The switch 226 includes a first terminal 276 that is coupled to a second terminal 272 of the capacitor 230. A second terminal 275 of the switch 226 is coupled to the inverting input terminal 253 of the differential amplifier 202. The switch 228 is connected in the feedback path of the differential amplifier 202 in parallel with the switch 226 and the capacitor 230 to switchably connect the inverting input terminal 253 to the non-inverting output terminal 283. The switch 228 includes a first terminal 279 that is coupled to the inverting input terminal 253, and a second terminal 280 that is coupled to the non-inverting output terminal 283.

The switch 204, switch 206, switch 208, switch 210, switch 212, switch 214, switch 216, switch 222, switch 224, switch 226, and switch 228 are controlled by switch control signals 118 generated by the control circuitry 106. Examples of how the switch 204, switch 206, switch 208, switch 210, switch 212, switch 214, switch 216, switch 222, switch 224, switch 226, and switch 228 are set during digitization of an input signal are provided with respect to FIGS. 7A, 7B, 8A, 8B, 9A, and 9B explained below.

Figure 3:
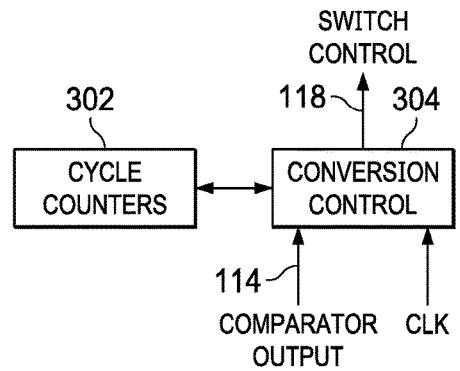
FIG. 3 shows a block diagram for an example of control circuitry used in a first-order sigma-delta analog-to-digital converter in accordance with the present disclosure.

FIG. 3 shows a block diagram for an example of control circuitry 300 used in a first-order sigma-delta analog-to-digital converter in accordance with the present disclosure. The control circuitry 300 is an example of the control circuitry 106. The control circuitry 300 includes cycle counters 302 and conversion control circuitry 304. The cycle counters 302 count the number of integration cycles executed during a particular portion of an analog-to-digital conversion. For example, a first counter may count the total number of integration cycles executed during a conversion, a second counter may count the number of integration cycles executed while output of the integrator circuit 102 is less than zero, a third counter may count the number of integration cycles executed while output of the integrator circuit 102 is greater than zero. A fourth counter may count the number of integration cycles executed between negative to positive voltage transitions at the output of the integrator circuit 102.

The conversion control circuitry 304 controls the operation of the integrator circuit 102 during analog-to-digital conversion. The conversion control circuitry 304 may include state machine circuitry that generates the switch control signals 118 based on the values of the cycle counters 302, the result 114 produced by the comparator 104, and a current execution state.

Figure 4:
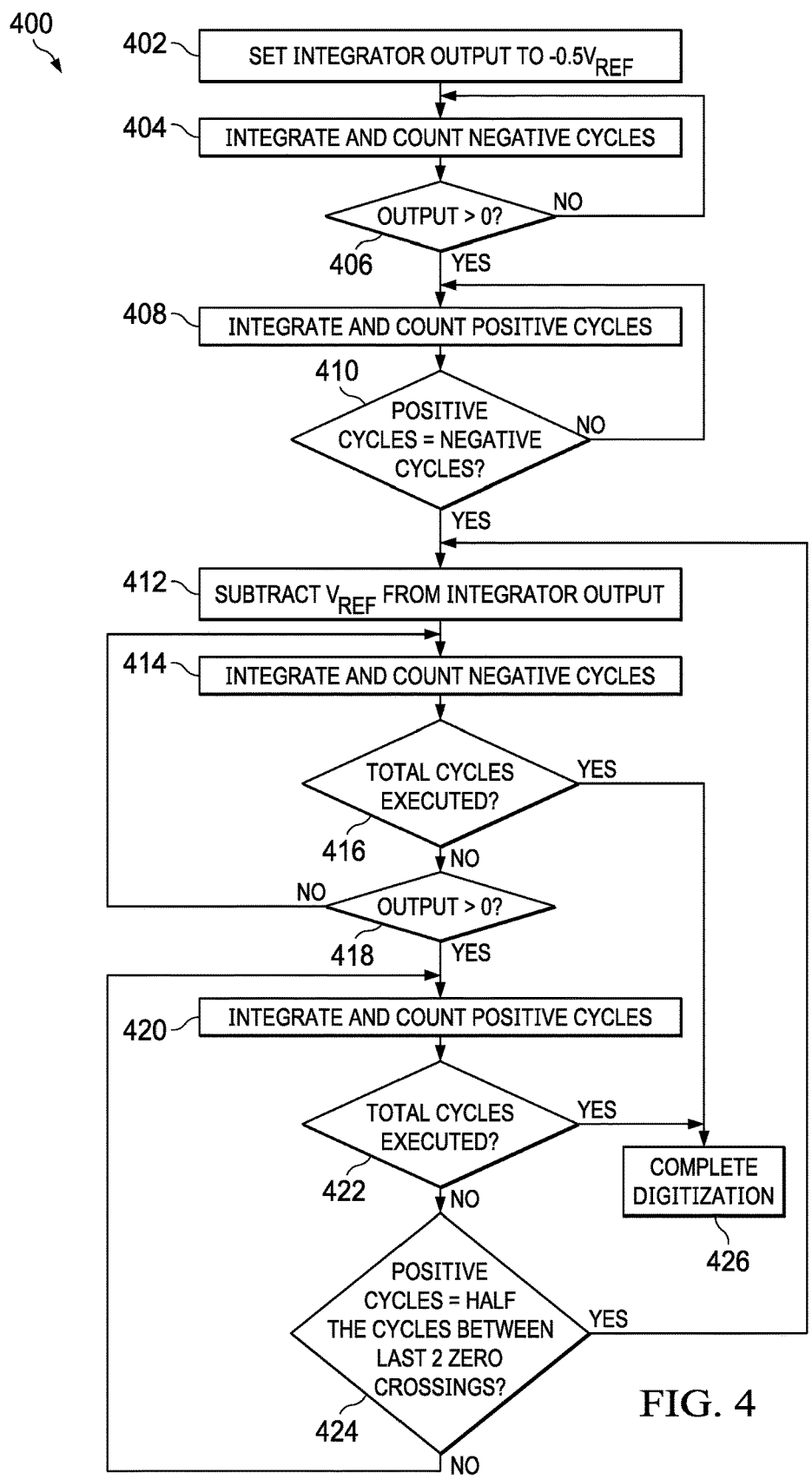
FIG. 4 shows a flow diagram for an example of a method 400 for operating a first-order sigma-delta analog-to-digital converter in accordance with the present disclosure.

FIG. 4 shows a flow diagram for a method 400 for operating a first-order sigma-delta analog-to-digital converter in accordance with the present disclosure. Though depicted sequentially as a matter of convenience, at least some of the actions shown can be performed in a different order and/or performed in parallel. Additionally, some implementations may perform only some of the actions shown. Operations of the method 400 may be performed by the first-order sigma-delta analog-to-digital converter 100 as controlled by the control circuitry 106.

Figure 6:
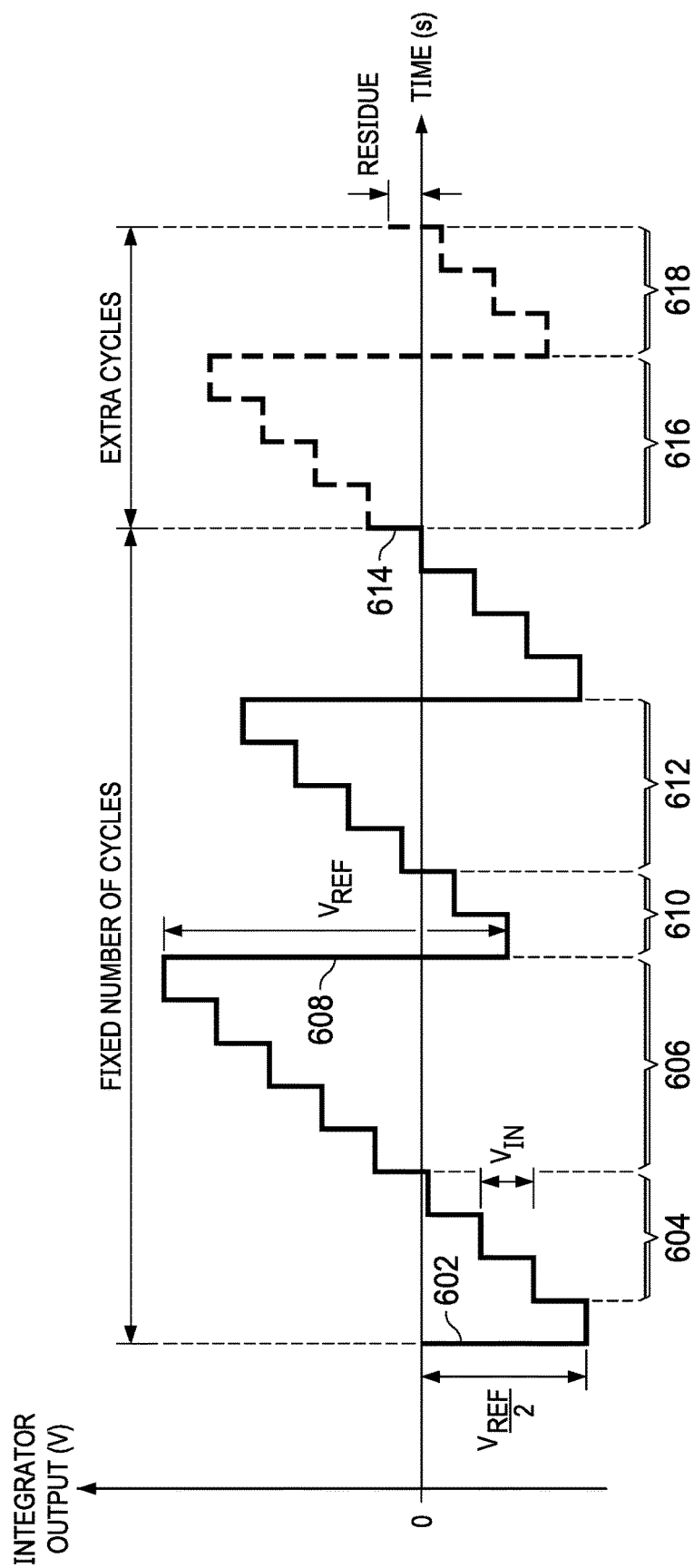
FIG. 6 shows a signal diagram illustrating operation of a first-order sigma-delta analog-to-digital converter in accordance with the present disclosure.
Figure 7A:
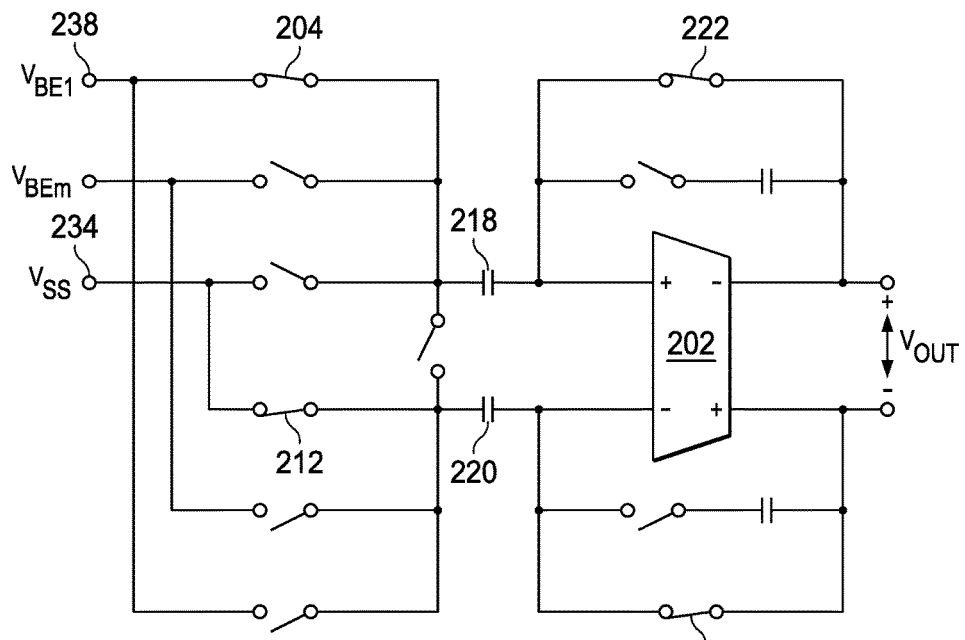
FIGS. 7A and 7B show an example of switch settings for initializing an integrator circuit used in a first-order sigma-delta analog-to-digital converter in accordance with the present disclosure.
Figure 7B:
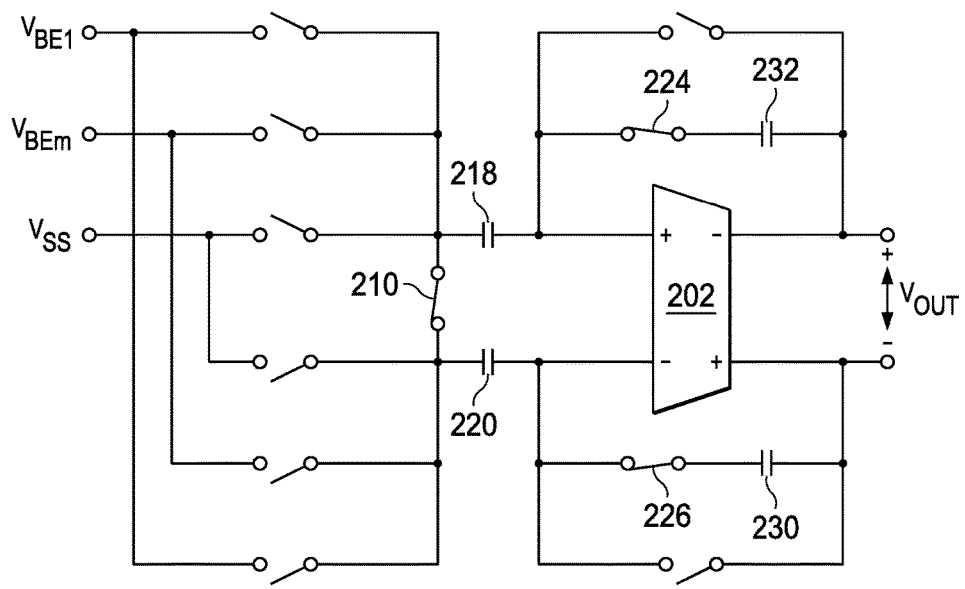

In block 402, a reference voltage ($V_{REF}$) and a unipolar input signal ($V_{IN}$) are provided at input terminals of the integrator circuit 102. The control circuitry 106 initializes the integrator circuit 102 to digitize $V_{IN}$ by setting the output 112 of the integrator circuit 102 to negative one-half of the reference voltage ($-0.5V_{REF}$). FIG. 6 shows the output 112 of the integrator circuit 102 set to $-0.5V_{REF}$ at 602. FIGS. 7A and 7B show switches of the integrator circuit 102 set to produce $-0.5V_{REF}$ at the output 112 of the integrator circuit 102. In FIG. 7A, the sampling phase, switch 204, switch 212, switch 222, and switch 228 are closed, and all other switches are open to connect the capacitor 218 to the input terminal 238 and connect the capacitor 220 to the input terminal 234. The voltage on the 238 may be the reference voltage and the voltage on the input terminal 234 may be ground in some implementations. In FIG. 7B, the integration phase, switch 210, switch 224, and switch 226 are closed, and all other switches are open to connect the capacitor 218 to the capacitor 220, and transfer charge from the capacitor 218 to the capacitor 232 and from the capacitor 220 to the capacitor 230, thereby setting the output of the differential amplifier 202 to $-0.5V_{REF}$.

Figure 8A:
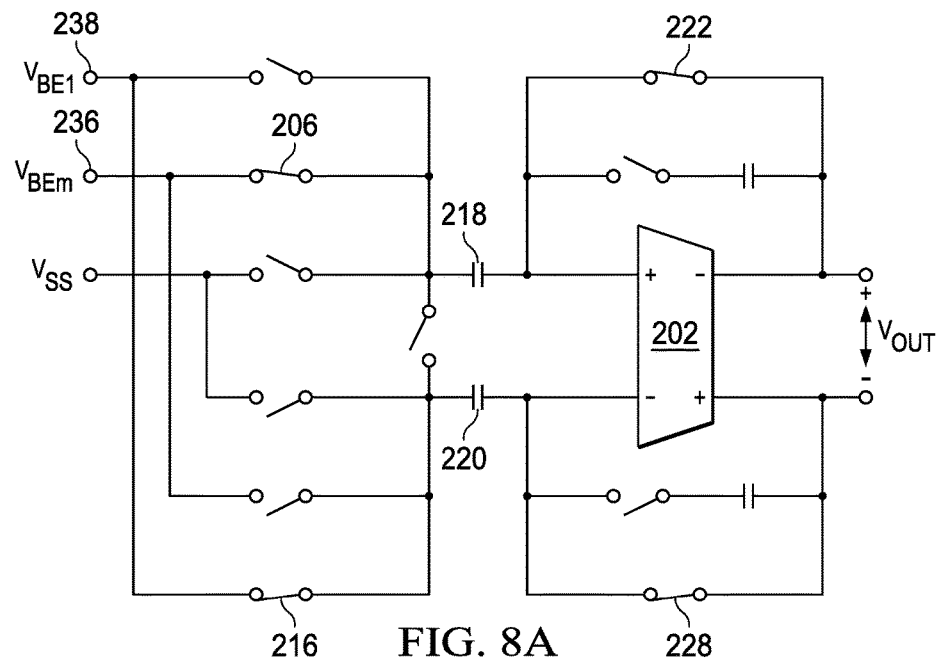
FIGS. 8A and 8B show an example of switch settings for adding an input voltage to an output of an integrator circuit used in a first-order sigma-delta analog-to-digital converter in accordance with the present disclosure.
Figure 8B:
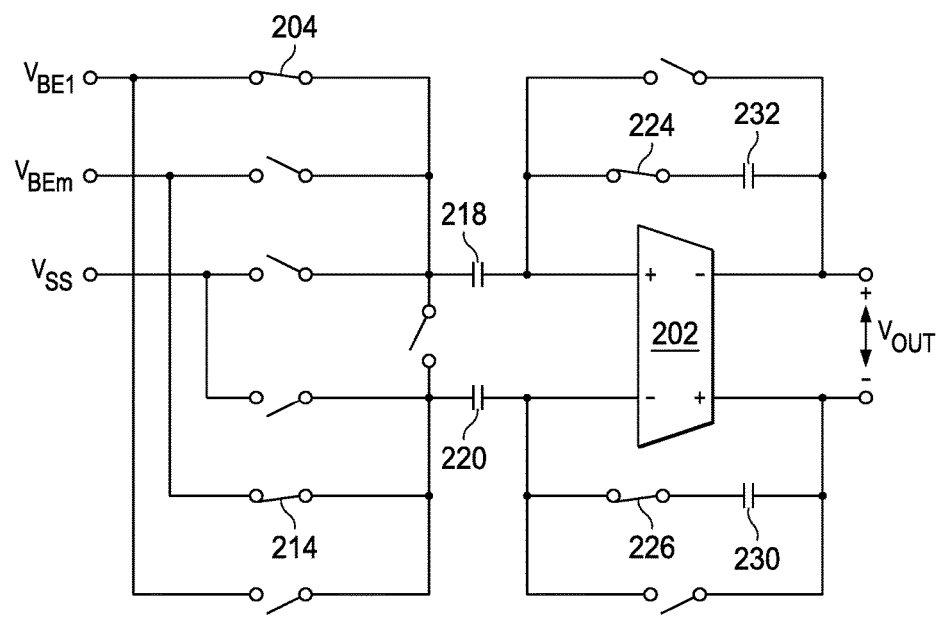

In block 404, the control circuitry 106 executes integration cycles and counts the number of integration cycles executed while the output 112 of the integrator circuit 102 is a negative voltage. In FIG. 6, interval 604 illustrates the time during which integration cycles are executed while the output 112 of the integrator circuit 102 is a negative voltage. In each integration cycle, the output voltage of the integrator circuit 102 is adjusted (e.g., increased) as a function of the sampled input voltage ($V_{IN}$), gain of the integrator circuit 102, and/or a process applied to the integrator circuit 102. For example, gain is applied to integrator input signals, such as $V_{IN}$, as a function of the ratio of integrator input capacitance to integrator feedback capacitance, or by application of a process such as correlated double sampling to the integrator circuit 102. FIGS. 8A and 8B show switches of the integrator circuit 102 set to execute an integration cycle. In FIG. 8A, the sampling phase, switch 206, switch 216, switch 222, and switch 228 are closed, and all other switches are open to connect the capacitor 218 to the input terminal 236 and connect the capacitor 220 to the input terminal 238. In the implementation of FIGS. 8A and 8B:

$V_{IN}$=signal at input terminal 238-signal at input terminal 236.

In FIG. 8B, the integration phase, switch 204, switch 214, switch 224, and switch 226 are closed, and all other switches are open to transfer charge from the capacitor 218 to the capacitor 232 and from the capacitor 220 to the capacitor 230, thereby incrementally changing the output of the differential amplifier 202. In some implementations, voltage to be digitized may be provided on the input terminal 238, and a ground voltage or other reference voltage may be provided on the input terminal 236.

In block 406, the control circuitry 106 determines whether the result 114 generated by the comparator 104 indicates that the output 112 of the integrator circuit 102 has changed from a negative voltage to a positive voltage (e.g., whether a zero crossing has occurred). If an output 112 of the integrator circuit 102 is negative, then execution continues in block 404.

If, in block 406, the output 112 of the integrator circuit 102 is positive, then, in block 408, the control circuitry 106 executes integration cycles and counts the number of integration cycles executed while the output 112 of the integrator circuit 102 is a positive voltage. In FIG. 6, interval 606 illustrates the time during which integration cycles are executed while the output 112 of the integrator circuit 102 is a positive voltage.

In block 410, the control circuitry 106 determines whether the number of integration cycles executed in the interval 606 is equal to the number of integration cycles executed in the interval 604. If the number of integration cycles executed in the interval 606 is not equal to the number of integration cycles executed in the interval 604, then execution continues in block 408.

Figure 9A:
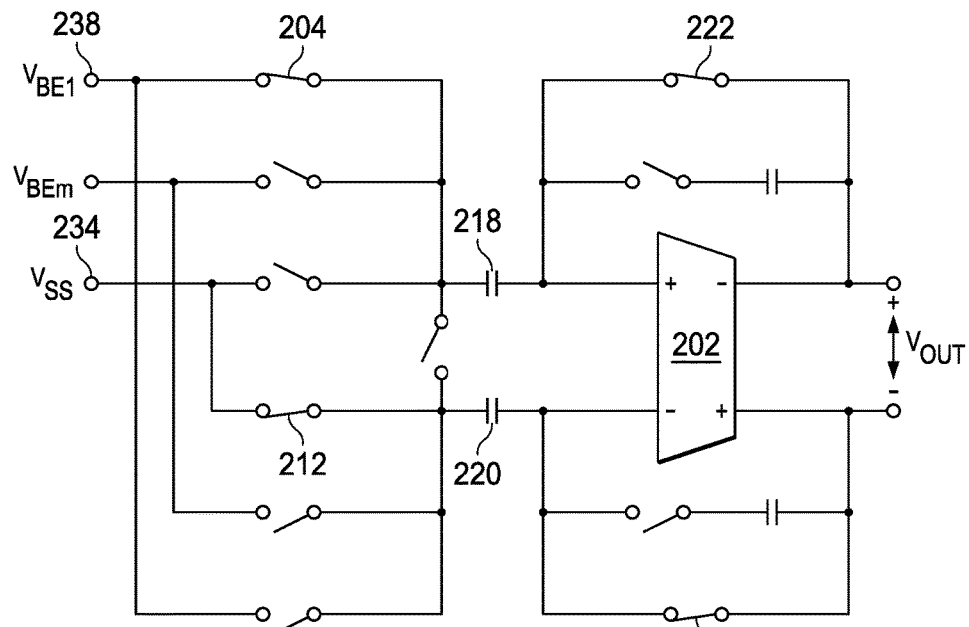
FIGS. 9A and 9B show an example of switch settings for subtracting a reference voltage from an output of an integrator circuit used in a first-order sigma-delta analog-to-digital converter in accordance with the present disclosure.
Figure 9B:
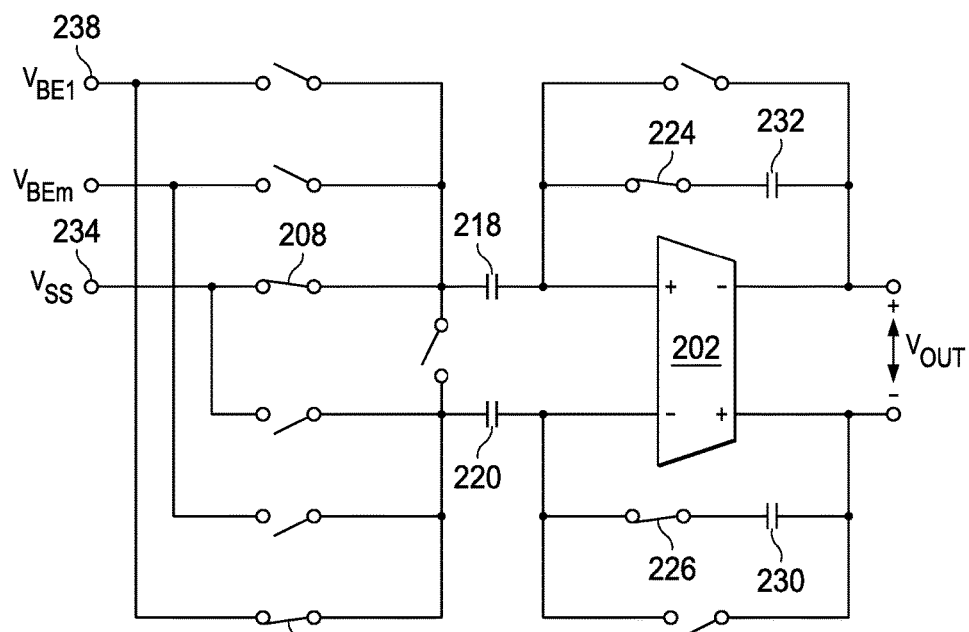

If, in block 410, the number of integration cycles executed in the interval 606 is equal to the number of integration cycles executed in the interval 604, then, in block 412, the control circuitry 106 subtracts the reference voltage ($V_{REF}$) from the output of the integrator circuit 102. FIG. 6 shows subtraction of $V_{REF}$ from the output of the integrator circuit 102 at 608. FIGS. 9A and 9B show switches of the integrator circuit 102 set to subtract $V_{REF}$ from the output of the integrator circuit 102. In FIG. 9A, the sampling phase, switch 204, switch 212, switch 222, and switch 228 are closed, and all other switches are open to connect the capacitor 218 to the input terminal 238 and connect the capacitor 220 to the input terminal 234. In FIG. 9B, the integration phase, switch 208, switch 216, switch 224, and switch 226 are closed, and all other switches are open to transfer the negative of the reference voltage from the capacitor 218 and the capacitor 220 to the capacitor 232 and the capacitor 230, thereby subtracting $V_{REF}$ from the output of the differential amplifier 202. The method 400 uses the subtraction to equalize the time that the output of the integrator circuit 102 is greater than zero and the time that the output of the integrator circuit 102 is less than zero.

In block 414, the control circuitry 106 executes integration cycles and counts the number of integration cycles executed while the output 112 of the integrator circuit 102 is a negative voltage.

The control circuitry 106 counts the total number integration cycles executed in the method 400. In block 416, the control circuitry 106 determines whether the total number of integration cycles executed thus far is equal to a predetermined number of integration cycles selected for digitization of the input signal. If the total number of integration cycles executed is equal to the predetermined number of integration cycles, then execution continues in block 426 to complete digitization. The operations of block 426 are explained in the description of the method 500 of FIG. 5.

If the total number of integration cycles executed is not equal to the predetermined number of integration cycles, then execution continues in block 418. In block 418, the control circuitry 106 determines whether the result 114 generated by the comparator 104 indicates that the output of the integrator circuit 102 has changed from a negative voltage to a positive voltage (e.g., whether a zero crossing has occurred). If the output of the integrator circuit 102 is negative, then execution continues in block 414. In FIG. 6, interval 610 illustrates the time during which integration cycles are executed while the output 112 of the integrator circuit 102 is a negative voltage.

If, in block 418, the output of the integrator circuit 102 is positive, then, in block 420, the control circuitry 106 executes integration cycles and counts the number of integration cycles executed while the output 112 of the integrator circuit 102 is a positive voltage. In FIG. 6, interval 612 illustrates the time during which integration cycles are executed while the output 112 of the integrator circuit 102 is a positive voltage.

In block 422, the control circuitry 106 determines whether the total number of integration cycles executed thus far is equal to the predetermined number of integration cycles selected for digitization of the input signal. If the total number of integration cycles executed is equal to the predetermined number of integration cycles, then execution continues in block 426 to complete digitization. The operations of block 426 are explained in the description of the method 500.

If the total number of integration cycles executed is not equal to the predetermined number of integration cycles, then execution continues in block 424. In block 424, the control circuitry 106 determines whether the number of integration cycles executed since the last negative to positive voltage transition at the output 112 of the integrator circuit 102 is equal to one-half the number of integration cycles executed between the last two negative to positive voltage transitions at the output 112 of the integrator circuit 102. If the number of integration cycles executed since the last negative to positive voltage transition at the output 112 of the integrator circuit 102 is less than one-half the number of integration cycles executed between the last two negative to positive voltage transitions at the output 112 of the integrator circuit 102, then execution continues in block 420, otherwise execution continues in block 412. In some implementations, if the number of integration cycles executed between the last two negative to positive voltage transitions at the output 112 of the integrator circuit 102 is odd (i.e., half the number of integration cycles is not an integer), then the integer quotient number of integration cycles is executed and 0.5 integration cycles are carried forward for later execution. For example, the 0.5 integration cycles carried forward is executed in a future iteration of blocks 412-424 in which the number of integration cycles executed between the last two negative to positive voltage transitions at the output 112 of the integrator circuit 102 is also odd (i.e., dividing the odd number of cycles by two and adding the 0.5 cycles carried forward to the result produces an integer). Accordingly, one-half the number of integration cycles executed between the last two negative to positive voltage transitions at the output 112 of the integrator circuit 102 may include 0.5 cycles carried forward from a previous set of positive integrations in blocks 420-424.

The operations of blocks 412-424 are repeated until the predetermined number of integration cycles selected for digitization of the input signal have been executed. In FIG. 6, the predetermined number of integration cycles has been executed at 614.

Figure 5:
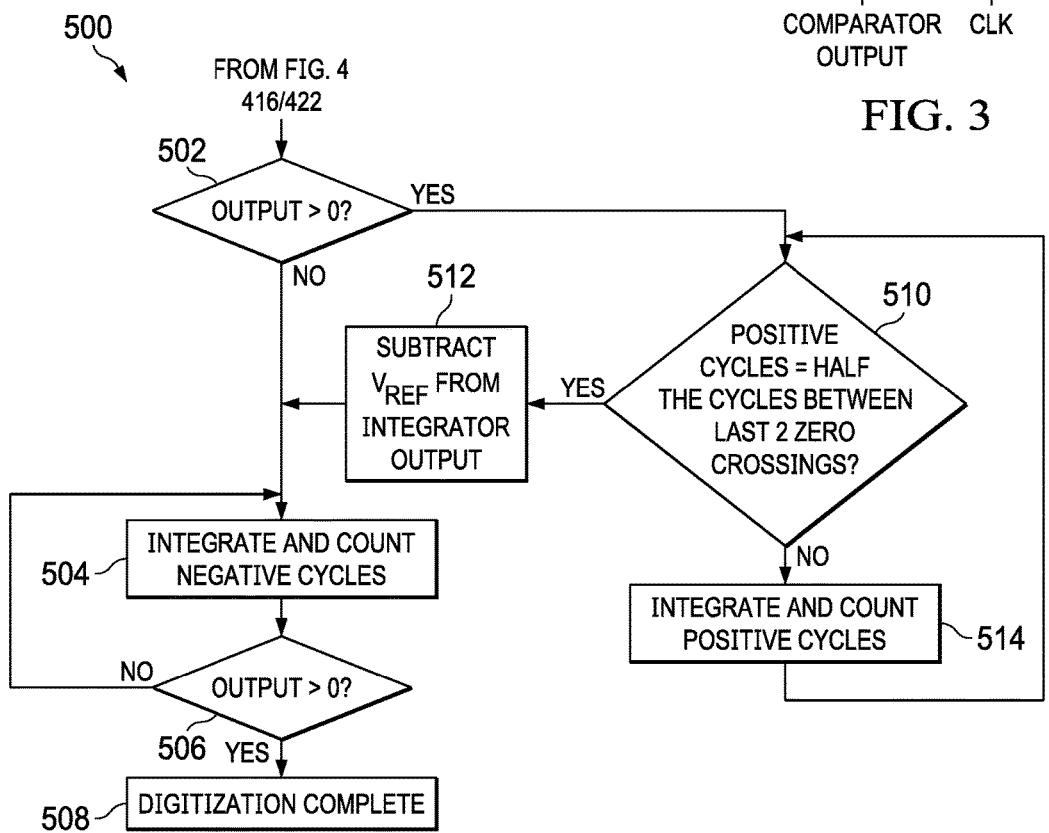
FIG. 5 shows a flow diagram for an example of a method 500 for completing digitization in a first-order sigma-delta analog-to-digital converter in accordance with the present disclosure.

FIG. 5 shows a flow diagram for a method 500 for completing digitization in a first-order sigma-delta analog-to-digital converter in accordance with the present disclosure. Though depicted sequentially as a matter of convenience, at least some of the actions shown can be performed in a different order and/or performed in parallel. Additionally, some implementations may perform only some of the actions shown. The method 500 may be executed as part of block 426 of the method 400. Operations of the method 500 may be performed by the first-order sigma-delta analog-to-digital converter 100 as controlled by the control circuitry 106. In the method 500, the first-order sigma-delta analog-to-digital converter 100 executes additional integration cycles after the predetermined total number of integration cycles have been executed to produce an output 112 of the integrator circuit 102 that is near zero volts.

In block 502, the control circuitry 106 determines whether the result 114 generated by the comparator 104 indicates that the output 112 of the integrator circuit 102 is a positive voltage. If the output 112 of the integrator circuit 102 is positive, then execution continues in block 510, otherwise execution continues in block 504.

In block 510, the control circuitry 106 determines whether the number of integration cycles executed since the last negative to positive voltage transition at the output 112 of the integrator circuit 102 is equal to one-half the number of integration cycles executed between the last two negative to positive voltage transitions at the output 112 of the integrator circuit 102. If the number of integration cycles executed since the last negative to positive voltage transition at the output 112 of the integrator circuit 102 is less than one-half the number of integration cycles executed between the last two negative to positive voltage transitions at the output 112 of the integrator circuit 102, then, in block 514, the control circuitry 106 executes integration cycles and counts the number of integration cycles executed while the output 112 of the integrator circuit 102 is a positive voltage. The operations of blocks 510 and 514 are repetitively executed until the number of integration cycles executed since the last negative to positive voltage transition at the output 112 of the integrator circuit 102 is equal to one-half the number of integration cycles executed between the last two negative to positive voltage transitions at the output 112 of the integrator circuit 102. In FIG. 6, integration cycles performed by execution of blocks 510 and 514 are shown as interval 616.

If, in block 510, the control circuitry 106 determines that the number of integration cycles executed since the last negative to positive voltage transition at the output 112 of the integrator circuit 102 is equal to one-half the number of integration cycles executed between the last two negative to positive voltage transitions at the output 112 of the integrator circuit 102, then, in block 512, the control circuitry 106 subtracts the reference voltage ($V_{REF}$) from the output of the integrator circuit 102, and execution continues in block 504. In some implementations, one-half the number of integration cycles executed between the last two negative to positive voltage transitions at the output 112 of the integrator circuit 102 may include one-half of an integration cycle carried forward from a previous set of positive integrations in blocks 420-424 of FIG. 4.

In block 504, the voltage at the output of the integrator circuit 102 is negative. The control circuitry 106 executes an integration cycle and counts the number of integration cycles executed while the output 112 of the integrator circuit 102 is a negative voltage.

In block 506, the control circuitry 106 determines whether the result 114 generated by the comparator 104 indicates that the output of the integrator circuit 102 is a positive voltage. If the output of the integrator circuit 102 is not positive, then execution continues in block 504.

If the output of the integrator circuit 102 is positive, then digitization is complete in block 508. In FIG. 6, integration cycles performed by execution of blocks 504 and 506 are shown as interval 618.

Figure 10:
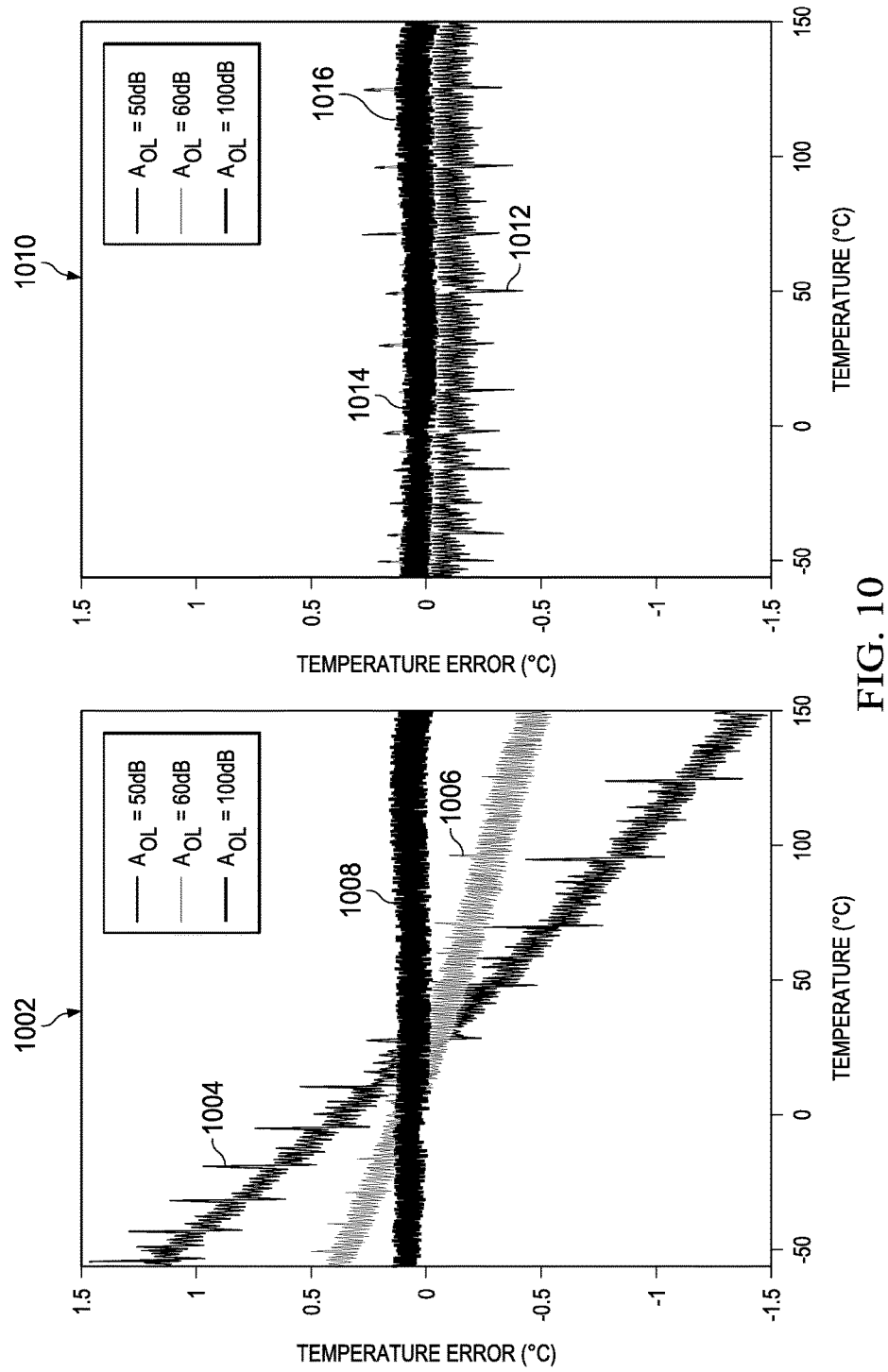
FIG. 10 shows performance of an example of a first-order sigma-delta analog-to-digital converter in accordance with the present disclosure.

FIG. 10 shows performance of an example of a first-order sigma-delta analog-to-digital converter in accordance with the present disclosure. The results shown in graph 1002 are provided using a first-order sigma-delta analog-to-digital converter to digitize temperature sensor output with a sigma-delta analog-to-digital converter that lacks the integrator leakage error balancing provided by the first-order sigma-delta analog-to-digital converter 100. In the graph 1002, temperature errors 1004, 1006, and 1008 are shown as produced with an integrator operational amplifier open loop gain of 50 dB, 60 dB and 100 dB, respectively. As expected, lower open loop gain results in higher errors.

In graph 1010 of FIG. 10, temperature sensor output is digitized using an implementation of the first-order sigma-delta analog-to-digital converter 100. In graph 1010, temperature errors 1012, 1014, and 1016 are shown as produced with a differential amplifier 202 having open loop gain of 50 dB, 60 dB and 100 dB, respectively. The temperature errors 1014 generally overlay the temperature errors 1016 in this example. As shown in graph 1010, the errors in temperature measurement resulting from integrator leakage are greatly reduced by the first-order sigma-delta analog-to-digital converter 100.

While examples of the first-order sigma-delta analog-to-digital converter 100 disclosed herein have been discussed with respect to digitization of a positive voltage, various implementations also digitize negative voltages. Such implementations detect the polarity of the voltage to digitize and reverse the polarity of the operations performed with respect to the integrator 102. For example, to initiate digitization of a positive voltage, an implementation sets the integrator output to $-V_{REF}/2$, stepwise increases integrator output voltage thereafter, and subtracts $V_{REF}$ from the integrator output as needed. To initiate digitization of a negative voltage, the implementation sets the integrator output to $V_{REF}/2$, stepwise decreases integrator output voltage thereafter, and adds $V_{REF}$ to the integrator output as needed.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A first-order sigma-delta analog-to-digital converter, comprising:
    an input terminal configured to receive a unipolar input signal to be digitized;
    an integrator circuit coupled to the input terminal;
    a comparator coupled to an output of the integrator circuit;
    control circuitry coupled to the integrator circuit and the comparator, the control circuitry configured to equalize time that an output signal generated by the integrator circuit is greater than zero volts and time that the output signal generated by the integrator circuit is less than zero volts during digitization of the unipolar input signal.

2. A first-order sigma-delta analog-to-digital converter of claim 1, wherein the control circuitry is configured to set the output signal generated by the integrator circuit to a one-half of reference voltage below zero volts to initiate digitization of the unipolar input signal.

3. The first-order sigma-delta analog-to-digital converter of claim 2, wherein the control circuitry is configured to execute a first number of integration cycles needed for the output signal generated by the integrator circuit to become a positive voltage after initiation of digitization.

4. The first-order sigma-delta analog-to-digital converter of claim 3, wherein, responsive to the output signal generated by the integrator circuit becoming a positive voltage, the control circuitry is configured to execute a second number of integration cycles equal to the first number of integration cycles.

5. The first-order sigma-delta analog-to-digital converter of claim 4, wherein, responsive to execution of the second number of integration cycles, the control circuitry is configured to subtract the reference voltage from the output signal generated by the integrator circuit.

6. The first-order sigma-delta analog-to-digital converter of claim 5, wherein, responsive to subtraction of the reference voltage from the output signal generated by the integrator circuit, the control circuitry is configured to execute a third number of integration cycles needed for the output signal generated by the integrator circuit to become a positive voltage.

7. The first-order sigma-delta analog-to-digital converter of claim 6, wherein, responsive to the output signal generated by the integrator circuit becoming a positive voltage, the control circuitry is configured to execute a fourth number of integration cycles equal to one-half a sum of the second number of integration cycles and the third number of integration cycles.

8. The first-order sigma-delta analog-to-digital converter of claim 5, wherein, responsive to execution of the second number of integration cycles, the control circuitry is configured to, until a predetermined number of integration cycles have been executed, repeatedly:
    subtract the reference voltage from the output signal generated by the integrator circuit;
    execute a number of integration cycles needed for the output signal generated by the integrator circuit to become positive; and
    execute a number of integration cycles equal to one-half the number of integration cycles executed between a last two negative voltage to positive voltage transitions of the output signal generated by the integrator circuit.

9. The first-order sigma-delta analog-to-digital converter of claim 8, wherein, responsive to execution of the predetermined number of integration cycles, the control circuitry is configured to execute integration cycles until the output signal generated by the integrator circuit transitions from a negative voltage to a positive voltage.

10. A method for operating a first-order sigma-delta analog-to-digital converter, comprising:
    receiving a unipolar signal for digitization;
    initiating digitization of the unipolar signal by setting an output signal generated by an integrator circuit of the first-order sigma-delta analog-to-digital converter to one-half of a reference voltage below zero volts; and
    during digitization of the unipolar signal, repeatedly subtracting the reference voltage from the output signal generated by the integrator circuit to equalize time that an output signal generated by the integrator circuit is greater than zero and time that the output signal generated by the integrator circuit is less than zero volts.

11. The method of claim 10, further comprising, responsive to initiating the digitization, executing a first number of integration cycles needed for the output signal generated by the integrator circuit to become a positive voltage.

12. The method of claim 11, further comprising responsive to the output signal generated by the integrator circuit becoming a positive voltage, executing a second number of integration cycles equal to the first number of integration cycles.

13. The method of claim 12, further comprising, responsive to execution of the second number of integration cycles:
    subtracting the reference voltage from the output signal generated by the integrator circuit;
    executing a third number of integration cycles needed for the output signal generated by the integrator circuit to become positive; and
    executing a fourth number of integration cycles equal to one-half of a sum of the second number of integration cycles and the third number of integration cycles.

14. The method of claim 13, further comprising, until a predetermined number of integration cycles have been executed, repeatedly:
    subtracting the reference voltage from the output signal generated by the integrator circuit;
    executing a number of integration cycles needed for the output signal generated by the integrator circuit to become positive; and
    executing a number of integration cycles equal to one-half the number of integration cycles executed between a last two negative voltage to positive voltage transitions of the output signal generated by the integrator circuit.

15. The method of claim 14, further comprising, responsive to execution of the predetermined number of integration cycles, halting digitization after execution of integration cycles causing the output signal generated by the integrator circuit transition from a negative voltage to a positive voltage.

16. A first-order sigma-delta analog-to-digital converter, comprising:
- an input terminal to receive a unipolar input signal to be digitized;
- an integrator circuit coupled to the input terminal, the integrator circuit comprising:
  - a differential amplifier;
  - a first input capacitor comprising a first terminal coupled to a non-inverting input terminal of the differential amplifier;
  - a second input capacitor comprising a first terminal coupled to an inverting input terminal of the differential amplifier;
  - a first switch comprising:
    - a first terminal coupled to a second terminal of the first input capacitor; and
    - a second terminal coupled to a power supply voltage;
  - a second switch comprising:
    - a first terminal coupled to a second terminal of the second input capacitor; and
    - a second terminal coupled to the power supply voltage;
- a comparator coupled to an output of the integrator circuit; and
- control circuitry coupled to the first switch, the second switch, and the comparator.

17. The first-order sigma-delta analog-to-digital converter of claim 16, wherein the integrator circuit further comprises:
- a third switch comprising:
  - a first terminal coupled to the second terminal of the first input capacitor; and
  - a second terminal coupled to the input terminal for the unipolar signal;
- a fourth switch comprising:
  - a first terminal coupled to the second terminal of the second input capacitor; and
  - a second terminal coupled to the input terminal for the unipolar signal;
wherein the control circuitry is coupled to the third switch and the fourth switch.

18. The first-order sigma-delta analog-to-digital converter of claim 16, wherein the integrator circuit further comprises:
- a third switch comprising:
  - a first terminal coupled to the second terminal of the first input capacitor; and
  - a second terminal coupled to the input terminal for the unipolar signal; and
- a fourth switch comprising:
  - a first terminal coupled to the second terminal of the second input capacitor; and
  - a second terminal coupled to the input terminal for the unipolar signal;
wherein the control circuitry is coupled to the third switch and the fourth switch.

19. The first-order sigma-delta analog-to-digital converter of claim 16, wherein the integrator circuit further comprises:
- a third switch comprising:
  - a first terminal coupled to the second terminal of the first input capacitor; and
  - a second terminal coupled to a second terminal for the second input capacitor;
wherein the control circuitry is coupled to the third switch.

20. The first-order sigma-delta analog-to-digital converter of claim 16, wherein the integrator circuit further comprises:
- a first feedback capacitor comprising a first terminal coupled to an inverting output terminal of the differential amplifier;
- a third switch comprising:
  - a first terminal coupled to a second terminal of the first feedback capacitor; and
  - a second terminal coupled to the non-inverting input terminal of the differential amplifier;
- a fourth switch comprising:
  - a first terminal coupled to the inverting output terminal of the differential amplifier; and
  - a second terminal coupled to the non-inverting input terminal of the differential amplifier;
- a second feedback capacitor comprising a first terminal coupled to a non-inverting output terminal of the differential amplifier;
- a fifth switch comprising:
  - a first terminal coupled to a second terminal of the second feedback capacitor; and
  - a second terminal coupled to the inverting input terminal of the differential amplifier;
- a sixth switch comprising:
  - a first terminal coupled to the non-inverting output terminal of the differential amplifier; and
  - a second terminal coupled to the inverting input terminal of the differential amplifier;
wherein the control circuitry is coupled to the third switch, the fourth switch, the fifth switch, and the sixth switch.

* * * * *